(12) United States Patent
Okamura

(10) Patent No.: US 12,368,041 B2
(45) Date of Patent: Jul. 22, 2025

(54) CLEANING METHOD OF CUP OF SUBSTRATE PROCESSING APPARATUS AND SUBSTRATE PROCESSING APPARATUS

(71) Applicant: Tokyo Electron Limited, Tokyo (JP)

(72) Inventor: Motohiro Okamura, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 149 days.

(21) Appl. No.: 17/997,603

(22) PCT Filed: Apr. 19, 2021

(86) PCT No.: PCT/JP2021/015879
§ 371 (c)(1),
(2) Date: Oct. 31, 2022

(87) PCT Pub. No.: WO2021/220865
PCT Pub. Date: Nov. 4, 2021

(65) Prior Publication Data
US 2023/0187199 A1   Jun. 15, 2023

(30) Foreign Application Priority Data
May 1, 2020   (JP) .................................. 2020-081376

(51) Int. Cl.
*H01L 21/02* (2006.01)
*H01L 21/67* (2006.01)

(52) U.S. Cl.
CPC .. *H01L 21/02052* (2013.01); *H01L 21/67023* (2013.01)

(58) Field of Classification Search
CPC ......... H01L 21/02052; H01L 21/67023; H01L 21/02087; H01L 21/027; H01L 21/67051;
(Continued)

(56) References Cited

U.S. PATENT DOCUMENTS 7,803,230 B2 * 9/2010 Amai ................ H01L 21/67046
134/21
2009/0241995 A1 * 10/2009 Somervell ......... H01L 21/31133
134/99.1
(Continued)

FOREIGN PATENT DOCUMENTS

JP    H11-238713 A    8/1999
JP    2007-324548 A    12/2007
(Continued)

OTHER PUBLICATIONS

JP-2008118042-A Written Description (Year: 2008).*
(Continued)

*Primary Examiner* — Alexander Markoff
(74) *Attorney, Agent, or Firm* — Chrisman Gallo Tochtrop LLC

(57) ABSTRACT

A cleaning method includes (A) and (B) described below. (A) A first processing liquid is supplied to a central portion of a top surface of a substrate from a first nozzle and, also, a second processing liquid is supplied to a periphery of the top surface of the substrate from a second nozzle in a state that the substrate is horizontally held inside a cup and the substrate is rotated in a first direction about a vertical rotation shaft. (B) During a discharge of the second processing liquid by the second nozzle, the second nozzle is moved in a diametrical direction of the substrate between a first position where a discharge line of the second nozzle touches the periphery of the top surface of the substrate and a second position where the discharge line of the second nozzle deviates from the substrate.

13 Claims, 13 Drawing Sheets

(58) Field of Classification Search
CPC ..... H01L 21/6708; H01L 21/304; B05B 1/14; B05B 1/24; B05B 12/16; B05B 13/04; B08B 3/02

See application file for complete search history.

(56) References Cited

U.S. PATENT DOCUMENTS

| | | | |
|---|---|---|---|
| 2017/0154796 A1 | 6/2017 | Aomatsu et al. | |
| 2017/0186599 A1* | 6/2017 | Takahashi | H01L 21/67051 |
| 2018/0036767 A1* | 2/2018 | Harumoto | B05D 3/04 |
| 2018/0315622 A1* | 11/2018 | Kobayashi | B08B 1/52 |
| 2021/0129194 A1* | 5/2021 | Ishibashi | H01L 21/02057 |
| 2022/0005736 A1 | 1/2022 | Naohara et al. | |

FOREIGN PATENT DOCUMENTS

| | | |
|---|---|---|
| JP | 2008118042 A * | 5/2008 |
| JP | 2013-004845 A | 1/2013 |
| JP | 2015-070073 A | 4/2015 |
| JP | 2015-176996 A | 10/2015 |
| JP | 2017-120887 A | 7/2017 |
| JP | 2017-163017 A | 9/2017 |
| JP | 2019-033157 A | 2/2019 |
| JP | 2019-145734 A | 8/2019 |
| KR | 102651287 B1 * | 7/2017 |
| KR | 10-2019-0022357 A | 3/2019 |
| WO | 2020/071206 A1 | 4/2020 |

OTHER PUBLICATIONS

KR102651287B1 Written Description (Year: 2017).*
KR 20110042014 (Year: 2011).*
International Search Report for PCT/JP2021/015879 dated Jul. 6, 2021.

* cited by examiner

FIG. 9

| PROCESS | S201 | S202 | S203 | S204 | S205 | S206 |
|---|---|---|---|---|---|---|
| ROTATION DIRECTION OF SUBSTRATE | RD1 | RD2 | RD1 | RD1 | RD2 | RD2 |
| CENTER NOZZLE | DIW (SC1) | DIW (SC1) | DIW (SC1) | DIW | DIW | — |
| FIRST CHEMICAL LIQUID NOZZLE | SC1 | SC1 | SC1+MOVE | — | — | — |
| FIRST PURE WATER NOZZLE | — | — | — | — | — | — |
| SECOND CHEMICAL LIQUID NOZZLE | — | — | — | — | — | — |
| SECOND PURE WATER NOZZLE | — | — | — | — | — | — |

FIG. 14

| PROCESS | S301 | S302 | S303 | S304 | S305 | S306 | S307 | S308 | S309 |
|---|---|---|---|---|---|---|---|---|---|
| ROTATION DIRECTION OF SUBSTRATE | RD2 | RD1 | RD2 | RD2 | RD1 | RD2 | RD1 | RD1 | RD1 |
| CENTER NOZZLE | DIW | DIW | DIW | DIW | DIW | DIW | DIW | DIW | — |
| FIRST CHEMICAL LIQUID NOZZLE | — | — | — | — | — | — | — | — | — |
| FIRST PURE WATER NOZZLE | — | — | — | — | DIW | DIW | DIW+MOVE | — | — |
| SECOND CHEMICAL LIQUID NOZZLE | — | — | — | — | — | — | — | — | — |
| SECOND PURE WATER NOZZLE | DIW | DIW | DIW+MOVE | — | — | — | — | — | — |

FIG. 15

| PROCESS | S401 | S402 | S403 | S404 | S405 | S406 | S407 | S408 | S409 |
|---|---|---|---|---|---|---|---|---|---|
| ROTATION DIRECTION OF SUBSTRATE | RD2 | RD1 | RD2 | RD2 | RD1 | RD2 | RD1 | RD1 | RD1 |
| CENTER NOZZLE | DIW (DHF) | DIW (DHF) | DIW (DHF) | DIW | DIW (SC1) | DIW (SC1) | DIW (SC1) | DIW | – |
| FIRST CHEMICAL LIQUID NOZZLE | – | – | – | – | SC1 | SC1 | SC1+ MOVE | – | – |
| FIRST PURE WATER NOZZLE | – | – | – | – | – | – | – | – | – |
| SECOND CHEMICAL LIQUID NOZZLE | DHF | DHF | DHF+ MOVE | – | – | – | – | – | – |
| SECOND PURE WATER NOZZLE | – | – | – | – | – | – | – | – | – |

CLEANING METHOD OF CUP OF SUBSTRATE PROCESSING APPARATUS AND SUBSTRATE PROCESSING APPARATUS

CROSS-REFERENCE TO RELATED APPLICATIONS

This Application is a U.S. national phase application under 35 U.S.C. § 371 of PCT Application No. PCT/JP2021/015879 filed on Apr. 19, 2021, which claims the benefit of Japanese Patent Application No. 2020-081376 filed on May 1, 2020, the entire disclosures of which are incorporated herein by reference.

TECHNICAL FIELD

The various aspects and embodiments described herein pertain generally to a cleaning method of a cup of a substrate processing apparatus and the substrate processing apparatus.

BACKGROUND

A substrate processing apparatus described in Patent Document 1 includes a spin chuck configured to hold a substrate horizontally and rotate it around a rotation axis, a nozzle configured to supply a processing liquid to a top surface of the substrate held by the spin chuck, and a cup surrounding the spin chuck to receive the processing liquid scattered from the substrate. The cup has an inclined surface that enlarges in a diametrical direction downwardly along the rotation axis. The substrate processing apparatus supplies a cleaning liquid to the spin chuck being rotated, thus allowing the cleaning liquid to be scattered to be supplied to the inclined surface of the cup.

Patent Document 1: International Publication No. 2015-176996

Exemplary embodiments provide a technique of broadening a cleaning range of a cup of a substrate processing apparatus.

SUMMARY

In an exemplary embodiment, there is provided a cleaning method of a cup of a substrate processing apparatus. The substrate processing apparatus includes a holder, a rotator, a liquid supply unit and a cup. The holder is configured to hold a substrate horizontally. The rotator is configured to rotate the holder about a vertical rotation shaft. The liquid supply unit is configured to supply a liquid to a top surface of the substrate held by the holder. The cup surrounds an edge of the substrate held by the holder to receive the liquid scattered from the edge of the substrate. The cleaning method includes (A) and (B) described below. (A) A first processing liquid is supplied to a central portion of the top surface of the substrate from a first nozzle and, also, a second processing liquid is supplied to a periphery of the top surface of the substrate from a second nozzle in a state that the substrate is horizontally held inside the cup and the substrate is rotated in a first direction about the vertical rotation shaft. (B) During a discharge of the second processing liquid by the second nozzle, the second nozzle is moved in a diametrical direction of the substrate between a first position where a discharge line of the second nozzle touches the periphery of the top surface of the substrate and a second position where the discharge line of the second nozzle deviates from the substrate.

BRIEF DESCRIPTION OF THE DRAWINGS

FIG. 9 is a process table showing a cleaning method according to the exemplary embodiment.

FIG. 14 is a process table showing a cleaning method according to a first modification example.

FIG. 15 is a process table showing a cleaning method according to a second modification example.

DETAILED DESCRIPTION

Figure 1:
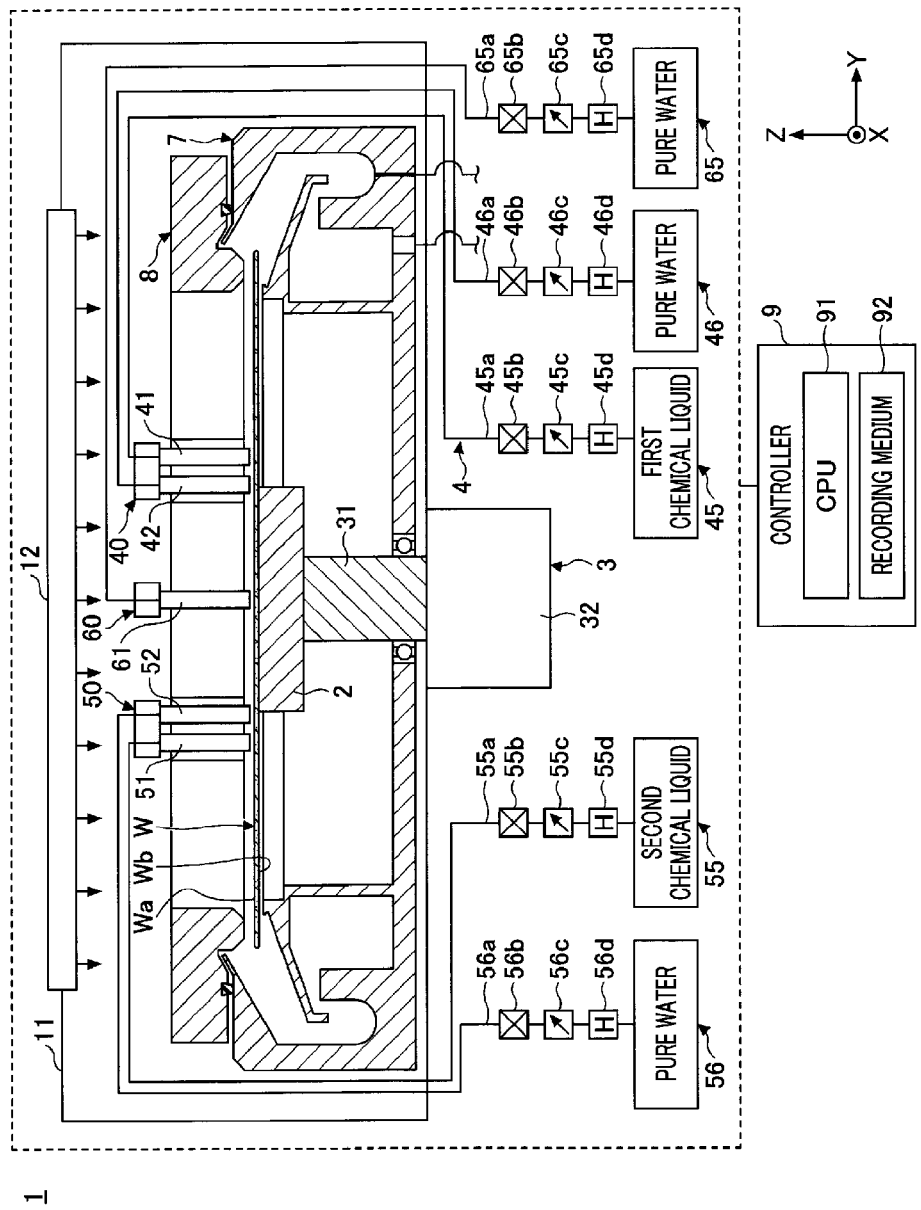
FIG. 1 is a cross sectional view illustrating a substrate processing apparatus according to an exemplary embodiment.

Hereinafter, an exemplary embodiment of the present disclosure will be described with reference to the accompanying drawings. In the various drawings, same or corresponding parts will be assigned same reference numerals, and redundant description may be omitted. In the present specification, the X-axis direction, the Y-axis direction, and the Z-axis direction are orthogonal to each other. The X-axis and Y-axis directions are horizontal directions, and the Z-axis direction is a vertical direction. Further, in the present specification, the r-axis direction is a diametrical direction of the substrate W, and the θ-axis direction is a circumferential direction of the substrate W. In the present specification, a "discharge line" means a line along which a processing liquid discharged from a nozzle passes, that is, an extension line of a discharge opening of the nozzle.

First, referring to FIG. 1, a substrate processing apparatus 1 will be explained. The substrate processing apparatus 1 is configured to process a substrate W. The substrate W is a silicon wafer in the present exemplary embodiment, but it may be a compound semiconductor wafer or a glass substrate. A non-illustrated film is formed on the substrate W. The film is, by way of example, a titanium nitride (TiN) film, an aluminum film, a tungsten film, a silicon nitride (SiN) film, a silicon oxide ($SiO_2$) film, a polysilicon film, a thermal oxide film, or the like. A plurality of films may be formed.

The substrate processing apparatus 1 supplies a chemical liquid to a periphery of the substrate W to remove a film previously formed on the periphery of the substrate W. The periphery of the substrate W includes a bevel, that is, a chamfered surface of the substrate W. The periphery of the substrate W is, for example, a portion within 50 mm inwards in a diametrical direction of the substrate W from an edge thereof. Meanwhile, a central portion of the substrate W is, for example, a portion within 50 mm outwards in the diametrical direction of the substrate W from a center thereof.

The substrate processing apparatus 1 is equipped with, for example, a holder 2 configured to hold the substrate W horizontally, a rotator 3 configured to rotate the holder 2 about a vertical rotation shaft 31, and a liquid supply unit 4 configured to supply a liquid to a top surface Wa of the substrate W held by the holder 2.

The holder 2 holds the substrate W horizontally so that the center of the substrate W coincides with a rotation center line of the rotation shaft 31. The holder 2 holds a central portion of a bottom surface Wb of the substrate W and does not hold a periphery of the bottom surface Wb of the substrate W. Although the holder 2 is a vacuum chuck in the present exemplary embodiment, it may be a mechanical chuck, an electrostatic chuck, or the like. The holder 2 is not particularly limited as long as it is a rotatable spin chuck.

The rotator 3 includes, by way of example, the vertical rotation shaft 31 and a rotation motor 32 configured to rotate the rotation shaft 31. A rotational driving force of the rotation motor 32 is transmitted to the holder 2 via the rotation shaft 31. The holder 2 is rotated both in a first direction RD1 and a second direction RD2 opposite to the first direction RD1.

When viewed from above, the first direction RD1 is a clockwise direction, and the second direction RD2 is a counterclockwise direction. Reversely, when viewed from above, the first direction RD1 may be a counterclockwise direction, and the second direction RD2 may be a clockwise direction.

Figure 2:
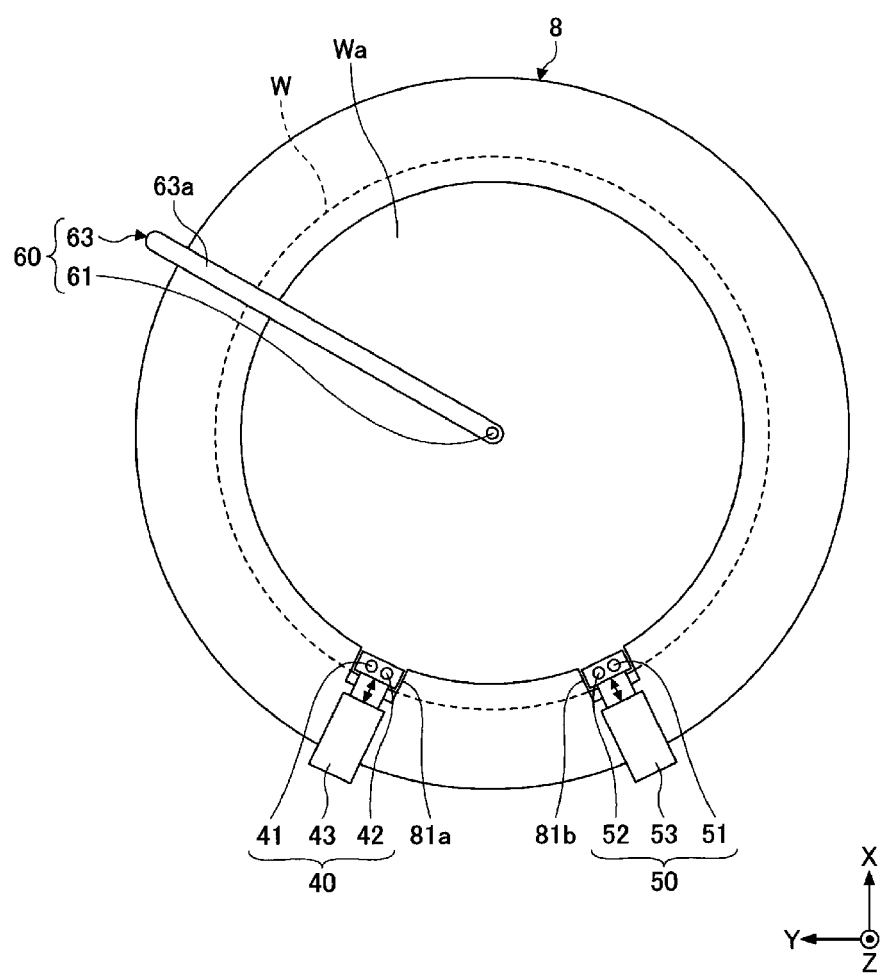
FIG. 2 is a plan view illustrating an example of the layout of nozzles of a liquid supply unit.

The liquid supply unit 4 includes a first processing unit 40 configured to supply a processing liquid to the periphery of the top surface Wa of the substrate W and a second processing unit 50 configured to supply a processing liquid to the periphery of the top surface Wa of the substrate W. The first processing unit 40 and the second processing unit 50 are disposed apart from each other in a circumferential direction of the substrate W, as illustrated in FIG. 2.

Figure 3:
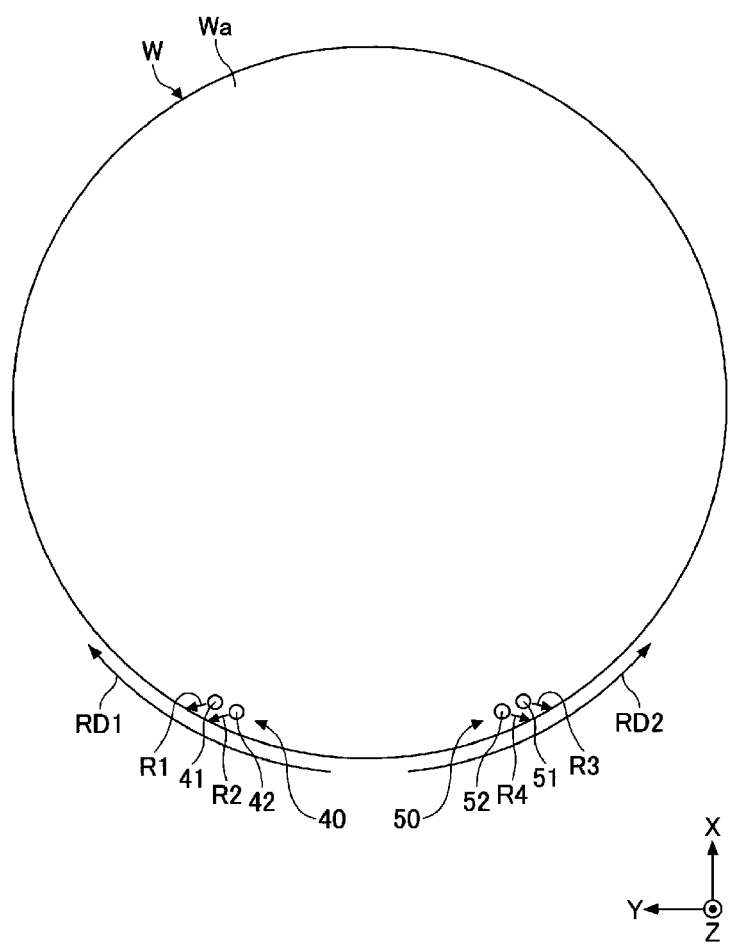
FIG. 3 is a plan view illustrating an example of a discharge line of a first chemical liquid nozzle.

First, the first processing unit 40 will be described. The first processing unit 40 has a first chemical liquid nozzle 41, as shown in FIG. 3. The first chemical liquid nozzle 41 supplies a first chemical liquid to the periphery of the top surface Wa of the substrate W. Although the first chemical liquid is not specifically limited, it is an alkaline solution in the present exemplary embodiment. The alkaline solution is, for example, SC1 (aqueous solution containing ammonium hydroxide and hydrogen peroxide) or an aqueous solution of hydrogen peroxide. The first chemical liquid nozzle 41 discharges the first chemical liquid obliquely downwards, for example. A discharge line R1 of the first chemical liquid nozzle 41 includes a component directed outwards in the diametrical direction of the substrate W and a component directed toward the first direction RD1.

Figure 4:
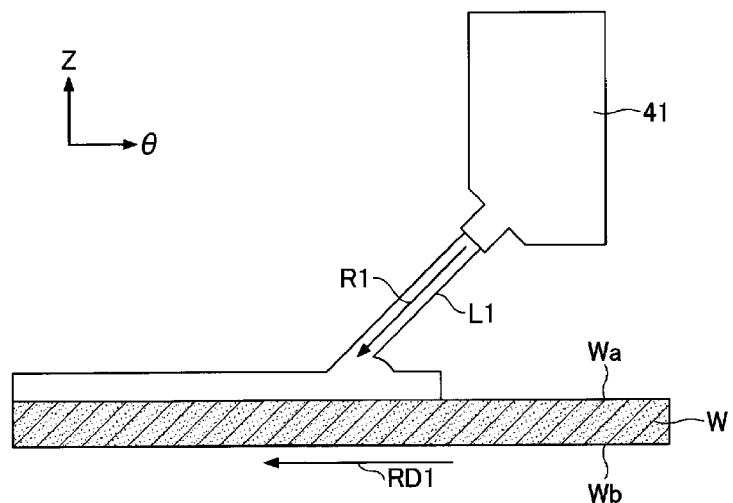
FIG. 4 is a diagram illustrating an example of supplying a first chemical liquid to a substrate being rotated in a first direction.
Figure 5:
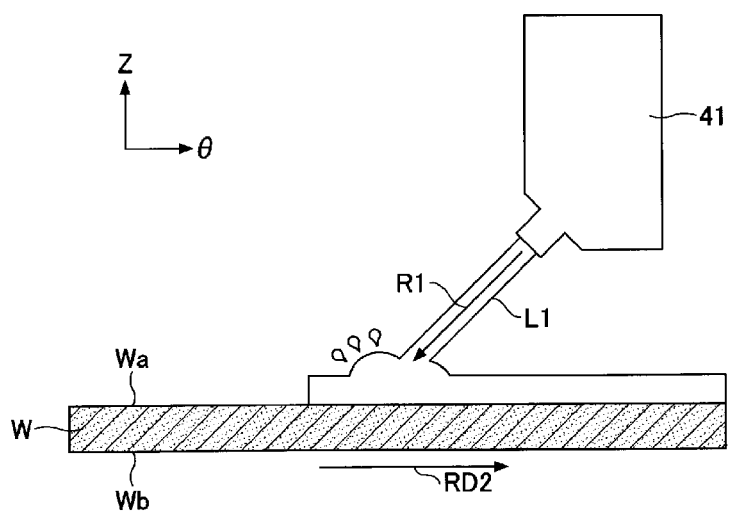
FIG. 5 is a diagram illustrating an example of supplying the first chemical liquid to the substrate being rotated in a second direction.

While the rotator 3 is rotating the substrate W in the first direction RD1, the first chemical liquid nozzle 41 discharges the first chemical liquid. As a result, the first chemical liquid is supplied onto the entire periphery of the top surface Wa of the substrate W. When the first chemical liquid is supplied, if the rotation direction of the substrate W is the first direction RD1 as shown in FIG. 4, the magnitude of a relative velocity between the substrate W and the first chemical liquid L1 is small, and, thus, an impact upon collision is small, as compared to a case where the rotation direction of the substrate W is the second direction RD2 as shown in FIG. 5. Therefore, splashing of the first chemical liquid L1 can be suppressed.

The first processing unit 40 has a first pure water nozzle 42, as shown in FIG. 3. The first pure water nozzle 42 is disposed next to the first chemical liquid nozzle 41. The first pure water nozzle 42 supplies pure water to the periphery of the top surface Wa of the substrate W to remove the first chemical liquid remaining on the periphery of the top surface Wa of the substrate W. The first pure water nozzle 42 discharges the pure water obliquely downwards, for example. A discharge line R2 of the first pure water nozzle 42 includes, like the discharge line R1 of the first chemical liquid nozzle 41, a component directed outwards in the diametrical direction of the substrate W and a component directed toward the first direction RD1.

While the rotator 3 is rotating the substrate W in the first direction RD1, the first chemical liquid nozzle 41 discharges the first chemical liquid, and, then, the first pure water nozzle 42 discharges the pure water. As a result, the pure water is supplied onto the entire periphery of the top surface Wa of the substrate W, so that the first chemical liquid is removed. When the pure water is supplied, if the rotation direction of the substrate W is the first direction RD1, the magnitude of a relative velocity between the substrate W and the pure water is small, as compared to the case where the rotation direction of the substrate W is the second direction RD2. Accordingly, an impact upon collision is small, so that splashing of the pure water can be suppressed.

The first processing unit 40 has a moving mechanism 43, as shown in FIG. 2. The moving mechanism 43 is configured to move the first chemical liquid nozzle 41 and the first pure water nozzle 42 in the diametrical direction of the substrate W. Further, the moving mechanism 43 may move the first chemical liquid nozzle 41 and the first pure water nozzle 42 in a vertical direction as well.

The first processing unit 40 has a first chemical liquid supply 45, as shown in FIG. 1. The first chemical liquid supply 45 includes a supply line 45a connected to the first chemical liquid nozzle 41. An opening/closing valve 45b configured to open or close a flow path of the first chemical liquid and a flow rate controller 45c configured to control a flow rate of the first chemical liquid are provided at a portion of the supply line 45a. A heater 45d configured to heat the first chemical liquid may also be provided at a portion of the supply line 45a.

The first processing unit 40 has a first pure water supply 46. The first pure water supply 46 includes a supply line 46a connected to the first pure water nozzle 42. An opening/closing valve 46b configured to open or close a flow path of the pure water and a flow rate controller 46c configured to control a flow rate of the pure water are provided at a portion of the supply line 46a. Further, a heater 46d configured to heat the pure water may also be provided at a portion of the supply line 46a.

Next, the second processing unit 50 will be explained. The second processing unit 50 has, as illustrated in FIG. 3, a second chemical liquid nozzle 51. The second chemical liquid nozzle 51 supplies a second chemical liquid to the periphery of the top surface Wa of the substrate W. Although not particularly limited, the second chemical liquid is an acidic solution in the present exemplary embodiment. The acidic solution is, for example, DHF (diluted hydrofluoric acid), HF (hydrofluoric acid), SC2 (aqueous solution containing hydrogen chloride and hydrogen peroxide), or a mixture of nitric acid and hydrofluoric acid. The second chemical liquid nozzle 51 discharges the second chemical liquid obliquely downwards, for example. A discharge line R3 of the second chemical liquid nozzle 51 includes a component directed outwards in the diametrical direction of the substrate W and a component directed toward the second direction RD2.

While the rotator 3 is rotating the substrate W in the second direction RD2, the second chemical liquid nozzle 51 discharges the second chemical liquid. As a result, the second chemical liquid is supplied onto the entire periphery of the top surface Wa of the substrate W. When the second chemical liquid is supplied, if the rotation direction of the substrate W is the second direction RD2, a magnitude of a relative velocity between the substrate W and the second chemical liquid is small, as compared to the case where the rotation direction of the substrate W is the first direction RD1. Accordingly, an impact upon collision is small, so that splashing of the second chemical liquid can be suppressed.

The second processing unit 50 has a second pure water nozzle 52. The second pure water nozzle 52 is disposed next to the second chemical liquid nozzle 51. The second pure water nozzle 52 supplies pure water to the periphery of the top surface Wa of the substrate W, and removes the second chemical liquid remaining on the periphery of the top surface Wa of the substrate W. The second pure water nozzle 52 discharges the pure water obliquely downwards, for example. A discharge line R4 of the second pure water nozzle 52 includes, like the discharge line R3 of the second chemical liquid nozzle 51, a component directed outwards in the diametrical direction of the substrate W and a component directed toward the second direction RD2.

While the rotator 3 is rotating the substrate W in the second direction RD2, the second chemical liquid nozzle 51 discharges the second chemical liquid, and, then, the second pure water nozzle 52 discharges the pure water. As a result, the pure water is supplied onto the entire periphery of the top surface Wa of the substrate W, so that the second chemical liquid is removed. When the pure water is supplied, if the rotation direction of the substrate W is the second direction RD2, a magnitude of a relative velocity between the substrate W and the pure water is small, as compared to the case where the rotation direction of the substrate W is the first direction RD1. Accordingly, an impact upon collision is small, so that splashing of the pure water can be suppressed.

The second processing unit 50 has, as illustrated in FIG. 2, a moving mechanism 53. The moving mechanism 53 is configured to move the second chemical liquid nozzle 51 and the second pure water nozzle 52 in the diametrical direction of the substrate W. Further, the moving mechanism 53 may move the second chemical liquid nozzle 51 and the second pure water nozzle 52 in the vertical direction as well.

The second processing unit 50 includes, as shown in FIG. 1, a second chemical liquid supply 55. The second chemical liquid supply 55 includes a supply line 55a connected to the second chemical liquid nozzle 51. An opening/closing valve 55b configured to open or close a flow path of the second chemical liquid and a flow rate controller 55c configured to control a flow rate of the second chemical liquid are provided at a portion of the supply line 55a. A heater 55d configured to heat the second chemical liquid may also be provided at a portion of the supply line 55a.

The second processing unit 50 has a second pure water supply 56. The second pure water supply 56 includes a supply line 56a connected to the second pure water nozzle 52. An opening/closing valve 56b configured to open or close a flow path of the pure water and a flow rate controller 56c configured to control a flow rate of the pure water are provided at a portion of the supply line 56a. Further, a heater 56d configured to heat the pure water may also be provided at a portion of the supply line 56a.

Figure 7:
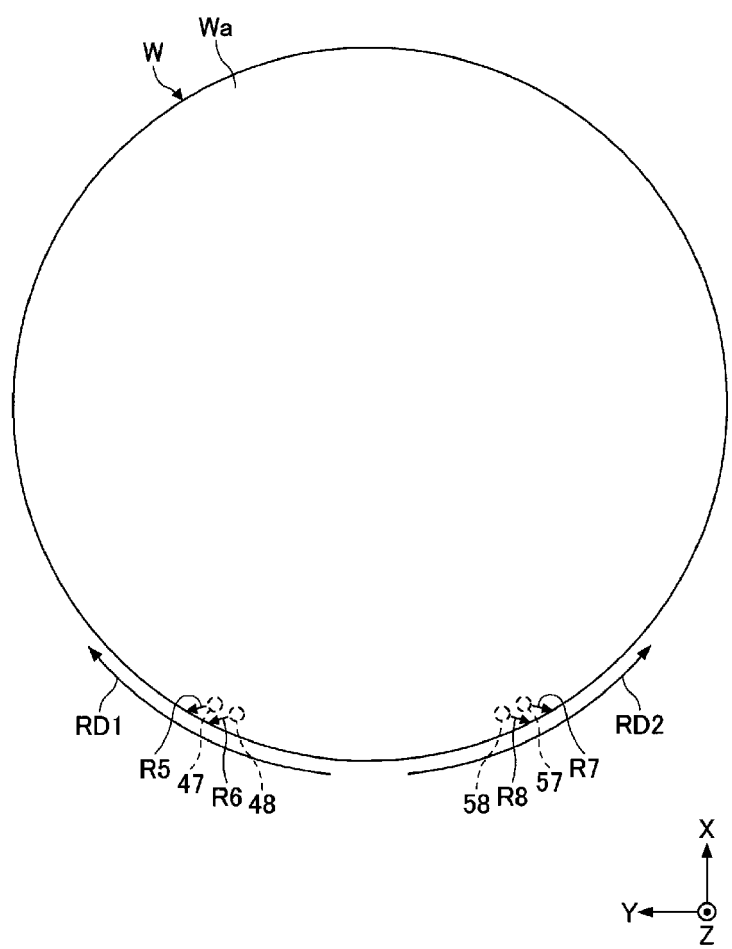
FIG. 7 is a plan view illustrating an example of the layout of nozzles below the substrate.

Moreover, as shown in FIG. 7, a third chemical liquid nozzle 47 and a third pure water nozzle 48 may be disposed under the substrate W. The third chemical liquid nozzle 47 supplies the first chemical liquid to a periphery of the bottom surface Wb of the substrate W. The third chemical liquid nozzle 47 discharges the first chemical liquid obliquely upwards, for example. A discharge line R5 of the third chemical liquid nozzle 47 includes a component directed outwards in the diametrical direction of the substrate W and a component directed toward the first direction RD1. The third pure water nozzle 48 supplies the pure water to the periphery of the bottom surface Wb of the substrate W. The third pure water nozzle 48 discharges the pure water obliquely upwards, for example. A discharge line R6 of the third pure water nozzle 48 includes a component directed outwards in the diametrical direction of the substrate W and a component directed toward the first direction RD1.

Moreover, a fourth chemical liquid nozzle 57 and a fourth pure water nozzle 58 may be disposed under the substrate W. The fourth chemical liquid nozzle 57 supplies the second chemical liquid to the periphery of the bottom surface Wb of the substrate W. The fourth chemical liquid nozzle 57 discharges the second chemical liquid obliquely upwards, for example. A discharge line R7 of the fourth chemical liquid nozzle 57 includes a component directed outwards in the diametrical direction of the substrate W and a component directed toward the second direction RD2. The fourth pure water nozzle 58 supplies the pure water to the periphery of the bottom surface Wb of the substrate W. The fourth pure water nozzle 58 discharges the pure water obliquely upwards, for example. A discharge line R8 of the fourth pure water nozzle 58 includes a component directed outwards in the diametrical direction of the substrate W and a component directed toward the second direction RD2.

The liquid supply unit 4 further includes a third processing unit 60 configured to supply a processing liquid to a central portion of the top surface Wa of the substrate W, as shown in FIG. 1. The third processing unit 60 includes, by way of example, a center nozzle 61 disposed directly above the rotation shaft 31, a moving mechanism 63 (see FIG. 2) configured to move the center nozzle 61, and a supply 65 configured to supply the processing liquid to the center nozzle 61.

The center nozzle 61 supplies pure water such as DIW (deionized water) to the central portion of the top surface Wa of the substrate W. The center nozzle 61 discharges the pure water directly downwards, for example. The pure water is supplied to the central portion of the top surface Wa of the substrate W being rotated, diffused onto the entire top surface of the substrate W by a centrifugal force, and is then shaken off the edge of the top surface Wa of the substrate W.

The moving mechanism 63 has a revolving arm 63a holding the center nozzle 61, and a non-illustrated rotating mechanism configured to rotate the revolving arm 63a. The rotating mechanism may also serve as a mechanism configured to move the revolving arm 63a up and down. The revolving arm 63a is horizontally disposed, holds the center nozzle 61 on its one end in a lengthwise direction thereof, and is rotated around a pivot extending downwards from the other end in the lengthwise direction thereof. In addition, the moving mechanism 63 may have a guide rail and a linear mechanism, instead of the revolving arm 63a and the rotating mechanism.

The supply 65 includes a supply line 65a connected to the center nozzle 61. An opening/closing valve 65b configured to open or close a flow path of the pure water and a flow rate controller 65c configured to control a flow rate of the pure water are provided at a portion of the supply line 65a. A heater 65d configured to heat the pure water may also be provided at a portion of the supply line 65a.

Figure 6:
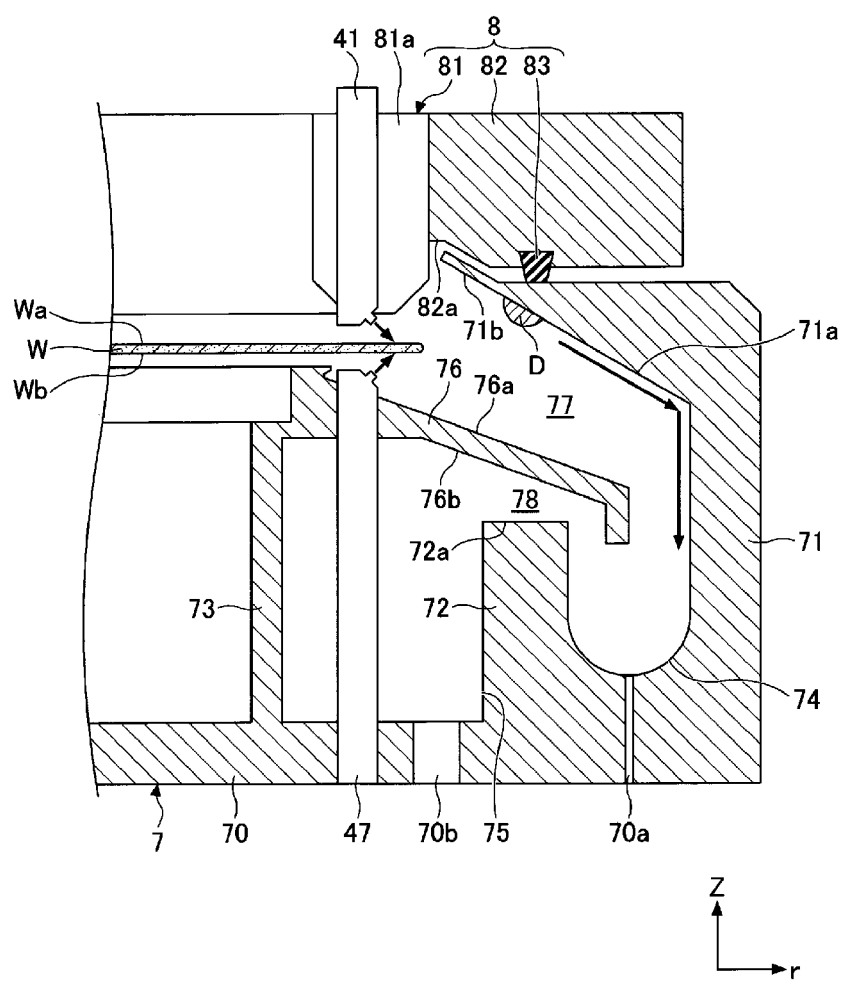
FIG. 6 is an enlarged cross sectional view illustrating a part of the substrate processing apparatus according to the exemplary embodiment.

The substrate processing apparatus 1 further includes a cup 7, as illustrated in FIG. 6. The cup 7 surrounds the edge of the substrate W held by the holder 2 to receive a liquid scattered from the edge of the substrate W. Although the cup 7 is not rotated together with the rotation shaft 31 in the present exemplary embodiment, it may be configured to be rotated together with the rotation shaft 31. The cup 7 includes a horizontal bottom wall 70, an outer peripheral wall 71 extending upwards from an edge of the bottom wall 70, a separation wall 72 disposed inside the outer peripheral wall 71, and an inner peripheral wall 73 disposed inside the separation wall 72. The outer peripheral wall 71, the separation wall 72, and the inner peripheral wall 73 are concentrically arranged. A recess 74 in which the liquid is collected is formed between the outer peripheral wall 71 and the separation wall 72. The liquid collected into the recess 74 is drained to the outside of the substrate processing apparatus 1 through a drain path 70a of the bottom wall 70. Further, a recess 75 in which a gas is collected is formed between the separation wall 72 and the inner peripheral wall 73. The gas collected into the recess 75 passes through an exhaust path 70b of the bottom wall 70 to be exhausted to the outside of the substrate processing apparatus 1. The separation wall 72 separates the recess 74 on the outer side and the recess 75 on the inner side to separate the liquid and the gas.

The outer peripheral wall 71 of the cup 7 has an inclined surface 71a that receives the liquid scattered from the edge of the substrate W. The inclined surface 71a is inclined downwards as it goes outwards in the diametrical direction of the substrate W. A passage 77 for both the liquid and the gas is formed between the inclined surface 71a of the outer peripheral wall 71 and a top surface 76a of a guide wall 76. Further, a passage 78 for the gas is formed between a bottom surface 76b of the guide wall 76 and a top surface 72a of the separation wall 72. The guide wall 76 is inclined downwards as it goes outwards in the diametrical direction from an upper end of the inner peripheral wall 73. The liquid passes through the passage 77 to be collected into the recess 74 on the outer side. The gas passes through the passages 77 and 78 and is collected into the recess 75 on the inner side.

The substrate processing apparatus 1 is further equipped with a cover 8. The cover 8 is disposed above the substrate W held by the holder 2 so as to be movable up and down. The cover 8 is a ring-shaped member facing the periphery of the top surface Wa of the substrate W. An annular gap is formed between the cover 8 and the substrate W, and a strong airflow is formed in this gap. The airflow is formed along the top surface Wa of the substrate W, and flows outwards in the diametrical direction of the substrate W. The airflow formed in this way may suppress mist from being adhered to the top surface Wa of the substrate W.

The cover 8 includes an inner cylindrical portion 81 facing the periphery of the top surface Wa of the substrate W, an outer cylindrical portion 82 disposed outside the inner cylindrical portion 81, and a seal portion 83 sealing a gap between the outer cylindrical portion 82 and the outer peripheral wall 71 of the cup 7. The outer peripheral wall 71 includes a protruding portion 71b inserted into a recess 82a of the outer cylindrical portion 82. A labyrinth structure is formed by the protruding portion 71b and the recess 82a. The seal portion 83 is disposed outside the labyrinth structure.

The inner cylindrical portion 81 is provided with an opening having a circular shape when viewed from above. The diameter of this opening is smaller than the diameter of the substrate W. A gap is formed between the inner cylindrical portion 81 and the periphery of the top surface Wa of the substrate W. The inner cylindrical portion 81 is projected further downwards than the outer cylinder portion 82 so that the gap is narrowed and, besides, a strong airflow is formed in the gap.

The cover 8 has, as illustrated in FIG. 2, a first notch 81a and a second notch 81b at an inner edge thereof. The first chemical liquid nozzle 41 and the first pure water nozzle 42 are disposed in the first notch 81a to be movable in the diametrical direction of the substrate W. Meanwhile, the second chemical liquid nozzle 51 and the second pure water nozzle 52 are disposed in the second notch 81b to be movable in the diametrical direction of the substrate W.

The substrate processing apparatus 1 is further quipped with a controller 9. The controller 9 controls, for example, the rotator 3 and the liquid supply unit 4. The controller 9 is, for example, a computer, and includes a CPU (Central Processing Unit) 91 and a recording medium 92 such as a memory. The recording medium 92 stores therein a program for controlling various kinds of processings performed in the substrate processing apparatus 1. The controller 9 controls an operation of the substrate processing apparatus 1 by causing the CPU 91 to execute the program stored in the recording medium 92.

Figure 8:
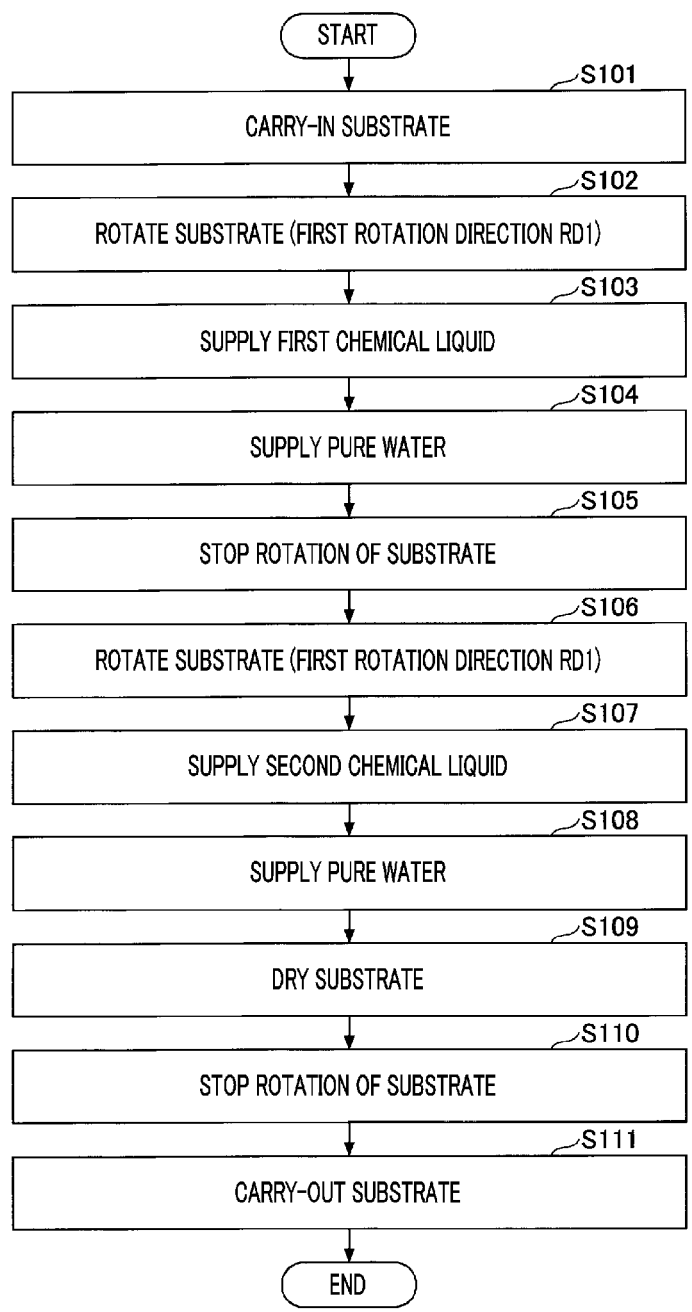
FIG. 8 is a flowchart illustrating a substrate processing method according to the exemplary embodiment.

Now, with reference to FIG. 8, etc., a substrate processing method will be discussed. Individual processes S101 to S111 shown in FIG. 8 are performed under the control of the controller 9. Further, the order of the processes S101 to S111 shown in FIG. 8 is not specifically limited, and the processes S102 to S104 and the processes S106 to S108 may be interchangeable.

First, in a process S101, a non-illustrated transfer device carries the substrate W into a processing vessel 11. The processing vessel 11 accommodates therein the holder 2, etc. After the transfer device places the substrate W on the holder 2 and the holder 2 holds the substrate W, the transfer device is retreated to the outside of the processing vessel 11. Thereafter, the cover 8 is lowered and placed on the outer peripheral wall 71 of the cup 7. A fan filter unit 12 is disposed at a ceiling of the processing vessel 11, and the fan filter unit 12 forms a downflow above the substrate W. As a result, an airflow heading toward the diametrically outer side of the substrate W flowing from the diametrically inner side thereof is formed between the substrate W and the cover 8. The airflow flows along the inclined surface 71a of the outer peripheral wall 71 of the cup 7 and is collected into the recess 75 on the inner side.

Next, in a process S102, the rotator 3 rotates the substrate W together with the holder 2 in the first direction RD1.

Thereafter, in a process S103, the first chemical liquid nozzle 41 supplies the first chemical liquid to the periphery of the top surface Wa of the substrate W. At this time, the third chemical liquid nozzle 47 also supplies the first chemical liquid to the periphery of the bottom surface Wb of the substrate W. The first chemical liquid is an alkaline solution such as SC1 and removes a film previously formed on the periphery of the substrate W. After shaken off the edge of the substrate W, the first chemical liquid flows along the inclined surface 71a of the outer peripheral wall 71 of the cup 7 and is collected into the recess 74 on the outer side.

Subsequently, in a process S104, the first pure water nozzle 42 supplies the pure water to the periphery of the top surface Wa of the substrate W. At this time, the third pure water nozzle 48 also supplies the pure water to the periphery of the bottom surface Wb of the substrate W. The pure water washes away the first chemical liquid remaining on the periphery of the substrate W. After shaken off the edge of the substrate W, the pure water flows along the inclined surface 71a of the outer peripheral wall 71 of the cup 7 and is collected into the recess 74 on the outer side.

Next, in a process S105, the rotator 3 stops the rotation of the substrate W.

Then, in a process S106, the rotator 3 rotates the substrate W together with the holder 2 in the second direction RD2.

Thereafter, in a process S107, the second chemical liquid nozzle 51 supplies the second chemical liquid to the periphery of the top surface Wa of the substrate W. At this time, the fourth chemical liquid nozzle 57 also supplies the second chemical liquid to the periphery of the bottom surface Wb of the substrate W. The second chemical liquid is an acidic solution such as DHF and removes a film previously formed on the periphery of the substrate W. After shaken off the edge of the substrate W, the second chemical liquid flows along the inclined surface 71a of the outer peripheral wall 71 of the cup 7 and is collected into the recess 74 on the outer side.

Subsequently, in a process S108, the second pure water nozzle 52 supplies the pure water to the periphery of the top surface Wa of the substrate W. At this time, the fourth pure water nozzle 58 also supplies the pure water to the periphery of the bottom surface Wb of the substrate W. The pure water washes away the second chemical liquid remaining on the periphery of the substrate W. After shaken off the edge of the substrate W, the pure water flows along the inclined surface 71a of the outer peripheral wall 71 of the cup 7 and is collected into the recess 74 on the outer side.

Next, in a process S109, by rotating the substrate W, the pure water remaining on the substrate W is shaken off to dry the substrate W. In the process S109, the rotation speed of the substrate W may be set to be higher than rotation speeds in the processes S107, S108, and the like.

Then, in a process S110, the rotator 3 stops the rotation of the substrate W.

Next, in a process S111, operations reverse to those of the process S101 are performed to carry out the substrate W. Specifically, first, the cover 8 is raised to its original position. Then, the transfer device advances into the processing vessel 11, receives the substrate W from the holder 2, and carries the received substrate W out of the processing vessel 11.

The processing for the substrate W shown in FIG. 8 is repeated while replacing substrates W. As a result, a deposit D is formed on the inclined surface 71a of the outer peripheral wall 71 of the cup 7, as shown in FIG. 6. The deposit D is formed as a droplet adhering to the inclined surface 71a of the outer peripheral wall 71 is dried. The deposit D is, for example, a re-precipitate of the film removed from the substrate W by the first chemical liquid. Since this re-precipitate is dissolved in the first chemical liquid, the deposit D can be removed with the first chemical liquid.

Now, a cleaning method using the first chemical liquid will be explained with reference to FIG. 9. Individual processes S201 to S206 shown in FIG. 9 are performed under the control of the controller 9. By way of example, when the number of processed substrates W for etching reaches a set number, the transfer device carries a substrate DW for cleaning into the processing vessel 11 and hands it over to the holder 2. If the holder 2 holds the substrate DW and the transfer device is retreated to the outside of the processing vessel 11, a processing starting from a process S201 is begun.

Unlike the substrate W for etching, the substrate DW for cleaning has no film formed thereon. The diameter of the substrate W for etching and the diameter of the substrate DW for cleaning are about the same. The substrate W for etching is, for example, a silicon wafer, and the substrate DW for cleaning is, for example, a silicon carbide wafer. In addition, as the substrate DW for cleaning, one having a film formed thereon may be used.

First, in a process S201, the holder 2 holds the substrate DW horizontally inside the cup 7, and the rotator 3 rotates the substrate DW in the first direction RD1. Further, in the process S201, the center nozzle 61 supplies pure water to a central portion of a top surface DWa of the substrate DW. The pure water flows outwards in the diametrical direction of the substrate DW by a centrifugal force to be shaken off the edge of the substrate DW.

Figure 10:
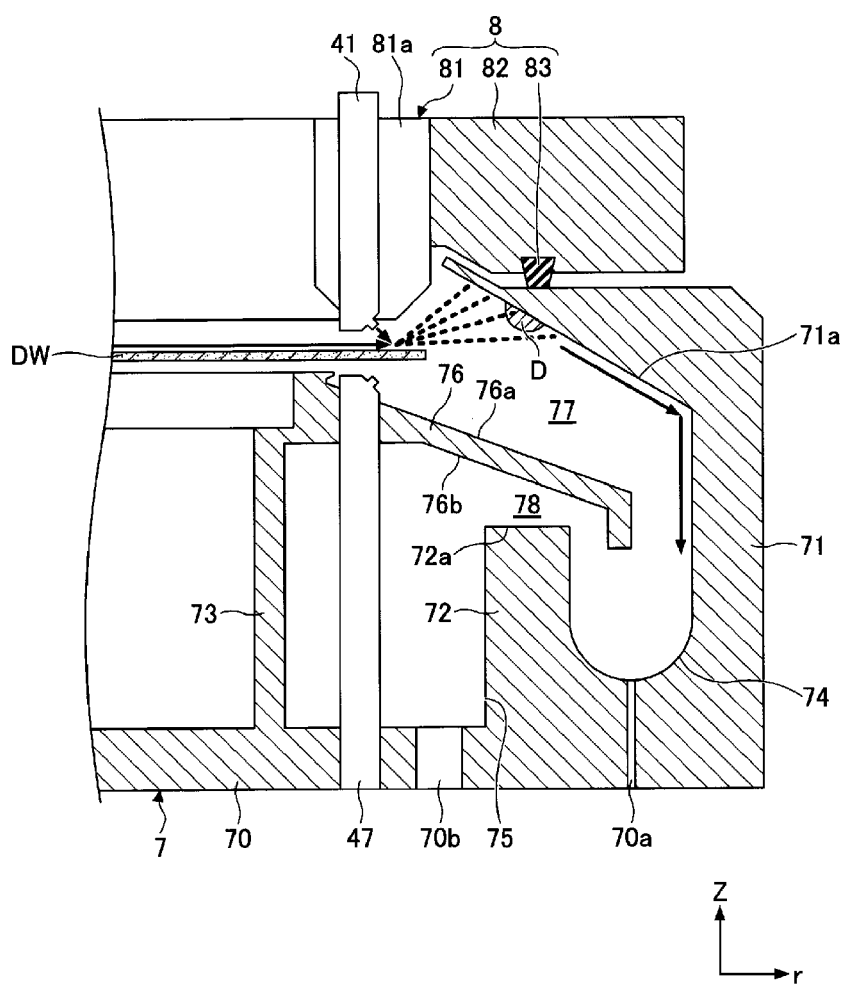
FIG. 10 is a diagram illustrating an example of a process S201 of FIG. 9.
Figure 11:
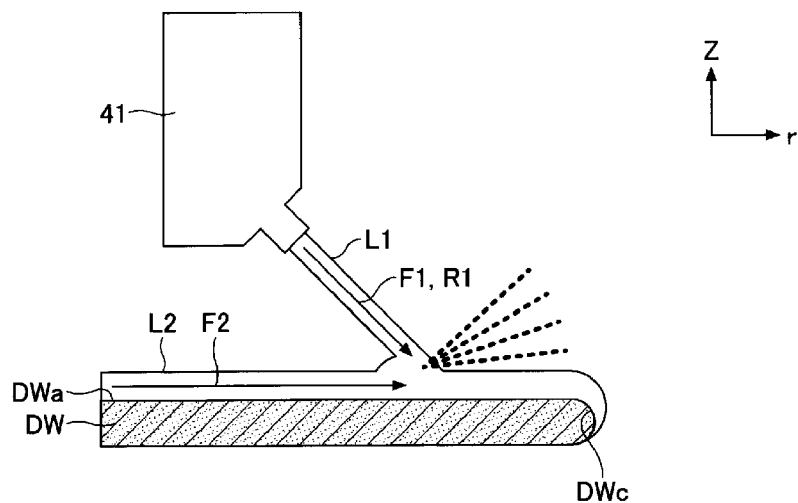
FIG. 11 is a diagram illustrating an example of the process S203 of FIG. 9.

In the process S201, the first chemical liquid nozzle 41 supplies the first chemical liquid L1 to a periphery of the top surface DWa of the substrate DW being rotated in the first direction RD1, as shown in FIG. 11. The first chemical liquid L1 is an alkaline solution such as SC1. A flow F1 of the first chemical liquid L1 and a flow F2 of the pure water L2 collide with each other, and an impact upon the collision causes droplets to be scattered in various directions. As shown in FIG. 10, the droplets of the first chemical liquid L1 can be supplied to a wide range of the inclined surface 71a of the outer peripheral wall 71, so that the deposit D can be removed by being dissolved in the first chemical liquid L1.

The larger the rotation speed of the substrate DW is, the faster the flow F2 of the pure water L2 would be, which makes it easier for the droplets to be scattered. The rotation speed of the substrate DW is in the range of, e.g., 1500 rpm to 2500 rpm. In the following processes S202 and S203, S301 to S303, S305 to S307, S401 to S403, and S405 to S407 as well, the rotation speed of the substrate DW may range from 1500 rpm to 2500 rpm.

In general, the impact caused by the collision is big at the moment when the collision is started. Therefore, in the process S201, the first chemical liquid nozzle 41 may intermittently discharge the first chemical liquid L1. In such a case, the flow F1 of the first chemical liquid L1 is formed intermittently, and the collision between the flow F1 of the first chemical liquid L1 and the flow F2 of the pure water L2 occurs intermittently. As a result, a big impact is generated intermittently, and the droplets may be easily formed.

In addition, in the process S201, the heater 45d may heat the first chemical liquid L1 before being discharged. Likewise, the heater 65d may heat the pure water L2 before being discharged. Since the temperature of the droplets being scattered is increased, the dissolution reaction of the deposit D is accelerated.

Thereafter, in the process S202, the first chemical liquid nozzle 41 supplies the first chemical liquid L1 to the periphery of the top surface DWa of the substrate DW being rotated in the second direction RD2. The droplets of the first chemical liquid L1 scattered from the periphery of the substrate DW during the rotation of the substrate DW are moved in the rotation direction of the substrate DW. A gas near the edge of the substrate DW is attracted to the substrate DW, rotated along with the substrate DW, and moves the droplets of the first chemical liquid L1 in the rotation direction of the substrate DW.

In the processes S201 and S202, the rotation direction of the substrate DW is reversed. As a result, the direction in which the droplets of the first chemical liquid L1 are moved is reversed, so that the droplets of the first chemical liquid L1 are uniformly supplied to the outer peripheral wall 71 in the entire circumferential direction thereof. Therefore, the deposit D can be removed from the outer peripheral wall 71 in the entire circumferential direction thereof.

The discharge line R1 of the first chemical liquid nozzle 41 has the component directed toward the first direction RD1, as stated above. In the process S202, the first chemical liquid L1 is supplied against the rotation direction of the substrate DW, unlike in the process S201. In the process S202, the magnitude of the relative velocity between the first chemical liquid L1 and the substrate DW is large, as compared to the process S201. Accordingly, the impact upon the collision is big, so that the droplets may be easily generated.

Figure 13:
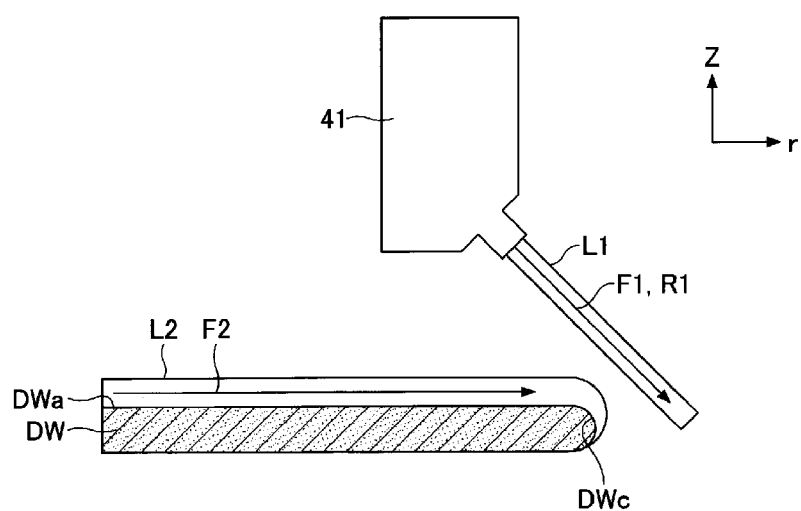
FIG. 13 is a diagram illustrating an example of the process S203 of FIG. 9, which is subsequent to FIG. 12.

Next, in a process S203, the same operation as in the process S201 is performed, except that the moving mechanism 43 moves the first chemical liquid nozzle 41 between a first position and a second position. The first position is a position where the discharge line R1 of the first chemical liquid nozzle 41 touches the periphery of the top surface DWa of the substrate DW, as shown in FIG. 11. Meanwhile, the second position is a position where the discharge line R1 of the first chemical liquid nozzle 41 deviates from the substrate DW, as shown in FIG. 13.

Figure 12:
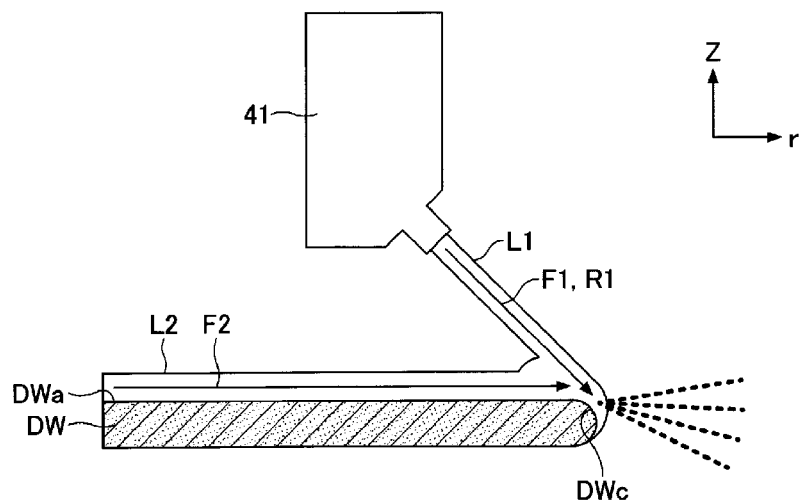
FIG. 12 is a diagram illustrating an example of the process S203 of FIG. 9, which is subsequent to FIG. 11.

In the process S203, the moving mechanism 43 may move the first chemical liquid nozzle 41 from the first position to the second position, or may move the first chemical liquid nozzle 41 from the second position to the first position. While the first chemical liquid nozzle 41 is being moved from the second position to the first position, the rotation speed of the substrate W may be increased. Either way, the discharge line R1 of the first chemical liquid nozzle 41 passes through the edge of the substrate DW. At this time, the scattering direction of the droplets is changed, as shown in FIG. 12. Therefore, it is possible to supply the droplets of the first chemical liquid L1 to the wide range.

When the discharge line R1 of the first chemical liquid nozzle 41 passes through the edge of the substrate DW, the first chemical liquid L1 is supplied from the first chemical liquid nozzle 41 to a bevel DWc of the substrate DW. The scattering direction of the droplet is changed by the bevel DWc. Therefore, it is possible to supply the droplets of the first chemical liquid L1 to the wide range.

In the process S203, the moving mechanism 43 may move the first chemical liquid nozzle 41 back and forth between the first position and the second position. By this reciprocation of the first chemical liquid nozzle 41, a sufficient amount of the droplets of the first chemical liquid L1 can be supplied to the wide range. The reciprocation of the first chemical liquid nozzle 41 may be repeated. In a case that the first chemical liquid nozzle 41 is moved back and forth between the first position and the second position, the rotation direction of the substrate W may be reversed at the moment the first chemical liquid nozzle 41 reaches the second position.

Subsequently, in a process S204, the center nozzle 61 supplies the pure water L2 to a central portion of the top surface DWa of the substrate DW being rotated in the first direction RD1. The pure water L2 is flown outwards in the diametrical direction of the substrate DW by a centrifugal force and shaken off the edge of the substrate DW, while washing away the first chemical liquid L1 remaining on the inclined surface 71a of the outer peripheral wall 71.

Next, in a process S205, the center nozzle 61 supplies the pure water L2 to the central portion of the top surface DWa of the substrate DW being rotated in the second direction RD2. Droplets of the pure water L2 shaken off the edge of the substrate DW during the rotation of the substrate DW are moved in the rotation direction of the substrate DW.

In the processes S204 and S205, the rotation direction of the substrate DW is reversed. As a result, the direction in which the droplets of the pure water L2 are moved is reversed, so that the droplets of the pure water L2 are uniformly supplied to the outer peripheral wall 71 in the entire circumferential direction thereof. Therefore, the first chemical liquid L1 can be removed from the outer peripheral wall 71 in the entire circumferential direction thereof.

Subsequently, in a process S206, the holder 2 holds the substrate DW horizontally inside the cup 7, and the rotator 3 rotates the substrate DW in the second direction RD2 to shake off the pure water L2 remaining on the substrate DW, thus allowing the substrate DW to be dried. Then, the transfer device receives the substrate DW from the holder 2 and carries it out of the processing vessel 11.

In the present exemplary embodiment, the center nozzle 61 corresponds to a first nozzle described in the claims, and the first chemical liquid nozzle 41 corresponds to a second nozzle described in the claims. Further, in the present exemplary embodiment, the pure water L2 corresponds to a first processing liquid described in the claims, and the first chemical liquid L1 corresponds to a second processing liquid described in the claims. In addition, although the first chemical liquid L1 is the alkaline solution, such as SC1, in the present exemplary embodiment, it may be an acidic liquid such as DHF. The order of the processes S201 to S205 is not limited to that shown in FIG. 9. For example, the order of processes S201 and S202 may be reversed.

In addition, the center nozzle 61 may discharge the first chemical liquid L1 instead of the pure water L2 in the processes S201 to S203. In such a case, instead of the flow F2 of the pure water L2, the flow F2 of the first chemical liquid L1 may be formed. In this case, since the flows F1 and F2 of the first chemical liquid L1 collide with each other, a decrease in the concentration of the first chemical liquid L1 can be suppressed, so that the deposit D can be dissolved efficiently.

Now, a cleaning method using the pure water will be described with reference to FIG. 14. The deposit D of this modification example is a reaction product of the first chemical liquid and the second chemical liquid, for example, a salt of the alkaline solution and the acidic solution. Since the salt dissolves in pure water, it can be removed with the pure water. Individual processes S301 to S309 shown in FIG. 14 are performed under the control of the controller 9. Conditions for starting a processing of the process S301 onwards are the same as the conditions for starting the processing of the process S201 onwards shown in FIG. 9.

First, in a process S301, the holder 2 holds the substrate DW horizontally inside the cup 7, and the rotator 3 rotates the substrate DW in the second direction RD2. Further, in the process S301, the center nozzle 61 supplies the pure water to the central portion of the top surface DWa of the substrate DW. The pure water flows outwards in the diametrical direction of the substrate DW by a centrifugal force to be shaken off the edge of the substrate DW.

Moreover, in the process S301, the second pure water nozzle 52 also supplies the pure water to the periphery of the top surface DWa of the substrate DW being rotated in the second direction RD2. The flows of the pure water collide with each other, and the impact upon the collision causes droplets to be scattered in various directions. The droplets of the pure water can be supplied to a wide range of the inclined surface 71a of the outer peripheral wall 71, and the deposit D can be removed by being dissolved in the pure water.

In general, the impact caused by the collision is big at the start of the collision. Therefore, in the process S301, the second pure water nozzle 52 may discharge the pure water intermittently. In such a case, the flow of the pure water is intermittently formed, and the collision between the flows of the pure water occurs intermittently. Thus, a big impact is generated intermittently, so that the droplets may be easily formed.

In addition, in the process S301, the heater 56d may heat the pure water before being discharged. Likewise, the heater 65d may heat the pure water before being discharged. Since the temperature of the scattered droplets is increased, the dissolution reaction of the deposit D is accelerated.

Next, in a process S302, the second pure water nozzle 52 supplies the pure water to the periphery of the top surface DWa of the substrate DW being rotated in the first direction RD1. Droplets of the pure water scattered from the periphery of the substrate DW during the rotation of the substrate DW are moved in the rotation direction of the substrate DW.

In the processes S301 and S302, the rotation direction of the substrate DW is reversed. As a result, the direction in which the droplets of the pure water is moved is reversed, so the droplets of the pure water is uniformly supplied to the outer peripheral wall 71 along the entire circumferential direction thereof. Accordingly, the deposit D can be removed from the outer peripheral wall 71 in the entire circumferential direction thereof.

The discharge line R4 of the second pure water nozzle 52 has the component directed toward the second direction RD2 as stated above. In the process S302, the pure water is supplied against the rotation direction of the substrate DW, unlike in the process S301. In the process S302, as compared to the process S301, the magnitude of the relative velocity between the pure water and the substrate DW is large. Therefore, since the impact upon the collision is large, the droplets may be easily formed.

Then, in a process S303, the same operation as in the process S301 is performed, except that the moving mechanism 53 moves the second pure water nozzle 52 between a third position and a fourth position. The third position is a position where the discharge line R4 of the second pure water nozzle 52 touches the periphery of the top surface DWa of the substrate DW. Meanwhile, the fourth position is a position where the discharge line R4 of the second pure water nozzle 52 deviates from the substrate DW.

In the process S303, the moving mechanism 53 may move the second pure water nozzle 52 from the third position to the fourth position, or may move the second pure water nozzle 52 from the fourth position to the third position. While the second pure water nozzle is being moved from the fourth position to the third position, the rotation speed of the substrate W may be increased. Either way, the discharge line R4 of the second pure water nozzle 52 passes through the edge of the substrate DW. At this time, the scattering direction of the droplets is changed. Therefore, it is possible to supply the droplets of the pure water to a wide range.

When the discharge line R4 of the second pure water nozzle 52 passes through the edge of the substrate DW, the pure water is supplied from the second pure water nozzle 52 to the bevel DWc of the substrate DW. The scattering direction of the droplet is changed by the bevel DWc. Therefore, it is possible to supply the droplets of the pure water to the wide range.

In the process S303, the moving mechanism 53 may move the second pure water nozzle 52 back and forth between the third position and the fourth position. By reciprocating the second pure water nozzle 52 in this way, it is possible to supply a sufficient amount of the droplets of the pure water to the wide range. The reciprocation of the second pure water nozzle 52 may be repeated. In a case that the second pure water nozzle 52 is moved back and forth between the third position and the fourth position, the rotation direction of the substrate W may be reversed at the moment the second pure water nozzle 52 reaches the fourth position.

Subsequently, in a process S304, the center nozzle 61 supplies the pure water to the central portion of the top surface DWa of the substrate DW being rotated in the second direction RD2. The process S304 is the same as the process S205 shown in FIG. 9.

Thereafter, in a process S305, the center nozzle 61 supplies the pure water to the central portion of the top surface DWa of the substrate DW being rotated in the first direction RD1. The pure water flows outwards in the diametrical direction of the substrate DW by a centrifugal force to be shaken off the edge of the substrate DW.

Moreover, in the process S305, the first pure water nozzle 42 supplies the pure water to the periphery of the top surface DWa of the substrate DW being rotated in the first direction RD1. The flows of the pure water collide with each other, and the impact upon the collision causes the droplets to be scattered in various directions. Accordingly, the droplets of the pure water can be supplied to the wide range of the inclined surface 71a of the outer peripheral wall 71, so that the deposit D can be removed by being dissolved in the pure water.

In general, the impact caused by the collision is big at the start of the collision. Therefore, in the process S305, the first pure water nozzle 42 may discharge the pure water intermittently. The flow of the pure water is intermittently formed, and the collision between the flows of pure water occurs intermittently. Therefore, a big impact occurs intermittently, so that the droplets may be easily formed.

In addition, in the process S305, the heater 46d may heat the pure water before being discharged. Likewise, the heater 65d may heat the pure water before being discharged. Since the temperature of the scattered droplet is increased, the dissolution reaction of the deposit D is accelerated.

Next, in a process S306, the first pure water nozzle 42 supplies the pure water to the periphery of the top surface DWa of the substrate DW being rotated in the second direction RD2. The droplets of the pure water scattered from the periphery of the substrate DW during the rotation of the substrate DW are moved in the rotational direction of the substrate DW.

In the processes S305 and S306, the rotation direction of the substrate DW is reversed. As a result, the direction in which the droplets of the pure water is moved is reversed, and the droplet of the pure water is uniformly supplied to the outer peripheral wall 71 along the entire circumferential direction thereof. Thus, the deposit D can be removed from the outer peripheral wall 71 in the entire circumferential direction thereof.

The discharge line R2 of the first pure water nozzle 42 has the component directed toward the first direction RD1 as described above. In the process S306, the pure water is supplied against the rotation direction of the substrate DW, unlike in the process S305. In the process S306, as compared to the process S305, the magnitude of the relative velocity of the pure water and the substrate DW is large. Thus, since the impact upon the collision is big, the droplets may be easily formed.

Subsequently, in a process S307, the same operation as in the process S305 is performed, except that the moving mechanism 43 moves the first pure water nozzle 42 between a fifth position and a sixth position. The fifth position is a position where the discharge line R2 of the first pure water nozzle 42 touches the periphery of the top surface DWa of the substrate DW. Meanwhile, the sixth position is a position where the discharge line R2 of the first pure water nozzle 42 deviates from the substrate DW.

In the process S307, the moving mechanism 43 may move the first pure water nozzle 42 from the fifth position to the sixth position, or may move the first pure water nozzle 42 from the sixth position to the fifth position. While the first pure water nozzle 42 is being moved from the sixth position to the fifth position, the rotation speed of the substrate W may be increased. Either way, the discharge line R2 of the first pure water nozzle 42 passes through the edge of the substrate DW. At this time, the scattering direction of the droplet is changed. Therefore, it is possible to supply the droplets of the pure water to a wide range.

When the discharge line R2 of the first pure water nozzle 42 passes through the edge of the substrate DW, the pure water is supplied from the first pure water nozzle 42 to the bevel DWc of the substrate DW. The scattering direction of the droplets is changed by the bevel DWc. Therefore, it is possible to supply the droplets of the pure water to the wide range.

In the process S307, the moving mechanism 43 may move the first pure water nozzle 42 back and forth between the fifth position and the sixth position. By reciprocating the first pure water nozzle 42 in this way, it is possible to supply a sufficient amount of the droplets of the pure water to the wide range. The reciprocation of the first pure water nozzle 42 may be repeated. In a case that the first pure water nozzle 42 is moved back and forth between the fifth position and the sixth position, the rotation direction of the substrate W may be reversed at the moment the first pure water nozzle 42 reaches the sixth position.

Thereafter, in a process S308, the holder 2 holds the substrate DW horizontally inside the cup 7, the rotator 3 rotates the substrate DW in the first direction RD1, and the center nozzle 61 supplies the pure water to the center portion of the top surface DWa of the substrate DW. The process S308 is the same as the process S204 shown in FIG. 9.

Next, in a process S309, the holder 2 holds the substrate DW horizontally inside the cup 7, and the rotator 3 rotates the substrate DW in the first direction RD1 to shake off the pure water remaining on the substrate DW, thus allowing the substrate DW to be dried. Thereafter, the transfer device receives the substrate DW from the holder 2 and carries it out of the processing vessel 11.

In this modification example, the center nozzle 61 corresponds to the first nozzle described in the claims; the first pure water nozzle 42 corresponds to the second nozzle described in the claims; and the second pure water nozzle 52 corresponds to a third nozzle described in the claims. In addition, in the present modification example, all of the first processing liquid, the second processing liquid, and a third processing liquid are pure water. The order of the processes S301 to S308 is not limited to the order shown in FIG. 14. For example, the order of the processes S301 to S304 and the processes S305 to S308 may be reversed.

Now, a cleaning method using both the first chemical liquid and the second chemical liquid will be described with reference to FIG. 15. The deposit D of this modification example contains two re-precipitates. One re-precipitate is a re-precipitate of the film removed from the substrate W by the first chemical liquid. Since this re-precipitate dissolves in the first chemical liquid, it can be removed with the first chemical liquid. The other re-precipitate is a re-precipitate of the film removed from the substrate W by the second chemical liquid. Since this re-precipitate dissolves in the second chemical liquid, it can be removed with the second chemical liquid. Individual processes S401 to S409 shown in FIG. 15 are performed under the control of the controller 9. Conditions for starting the processing of the process S401 onwards are the same as the conditions for starting the processing of the process S201 onwards shown in FIG. 9.

First, in a process S401, the holder 2 holds the substrate DW horizontally inside the cup 7, and the rotator 3 rotates the substrate DW in the second direction RD2. Further, in the process S401, the center nozzle 61 supplies the pure water to the central portion of the top surface DWa of the substrate DW. The pure water flows outwards in the diametrical direction of the substrate DW by a centrifugal force to be shaken off the edge of the substrate DW.

Further, in the process S401, the second chemical liquid nozzle 51 supplies the second chemical liquid to the periphery of the top surface DWa of the substrate DW being rotated in the second direction RD2. The second chemical liquid is an acidic solution such as DHF. The flow of the second chemical liquid and the flow of the pure water collide with each other, and the impact upon the collision causes the droplets to be scattered in various directions. The droplets of the second chemical liquid can be supplied to a wide range of the inclined surface 71a of the outer peripheral wall 71, so that some of the deposit D can be removed by being dissolved in the second chemical liquid.

In general, the impact caused by the collision is big at the start of the collision. Accordingly, in the process S401, the second chemical liquid nozzle 51 may discharge the second chemical liquid intermittently. In such a case, the flow of the second chemical liquid is intermittently formed, and the collision between the flow of the second chemical liquid and the flow of the pure water occurs intermittently. Accordingly, a big impact is generated intermittently, so that the droplets may be easily formed.

Furthermore, in the process S401, the heater 55d may heat the second chemical liquid before being discharged. Likewise, the heater 65d may heat the pure water before being discharged. Since the temperature of the scattered droplets is increased, the dissolution reaction of the deposit D is accelerated.

Thereafter, in a process S402, the second chemical liquid nozzle 51 supplies the second chemical liquid to the periphery of the top surface DWa of the substrate DW being rotated in the first direction RD1. During the rotation of the substrate DW, the droplets of the second chemical liquid scattered from the periphery of the substrate DW are moved in the rotational direction of the substrate DW.

In the processes S401 and S402, the rotation direction of the substrate DW is reversed. As a result, the direction in which the droplets of the second chemical liquid are moved is reversed, and the droplets of the second chemical liquid are uniformly supplied to the outer peripheral wall 71 along the entire circumferential direction thereof. Therefore, the deposit D can be removed from the outer peripheral wall 71 in the entire circumferential direction thereof.

The discharge line R3 of the second chemical liquid nozzle 51 has the component directed toward the second direction RD2 as stated above. In the process S402, the second chemical liquid is supplied against the rotation direction of the substrate DW, unlike in the process S401. In the process S402, as compared to the process S401, the magnitude of the relative velocity between the second chemical liquid and the substrate DW is large. Accordingly, the impact upon the collision is big, so that the droplets may be easily generated.

Next, in a process S403, the same operation as in the process S401 is performed, except that the moving mechanism 53 moves the second chemical liquid nozzle 51 between a seventh position and an eighth position. The seventh position is a position where the discharge line R3 of the second chemical liquid nozzle 51 touches the periphery of the top surface DWa of the substrate DW. Meanwhile, the eighth position is a position where the discharge line R3 of the second chemical liquid nozzle 51 deviates from the substrate DW.

In the process S403, the moving mechanism 53 may move the second chemical liquid nozzle 51 from the seventh position to the eighth position, or may move the second chemical liquid nozzle 51 from the eighth position to the seventh position. While the second chemical liquid nozzle 51 is being moved from the eighth position to the seventh position, the rotation speed of the substrate W may increase. Either way, the discharge line R3 of the second chemical liquid nozzle 51 passes through the edge of the substrate DW. At this time, the scattering direction of the droplets is changed. Therefore, it is possible to supply the droplets of the second chemical liquid to a wide range.

When the discharge line R3 of the second chemical liquid nozzle 51 passes through the edge of the substrate DW, the second chemical liquid is supplied from the second chemical liquid nozzle 51 to the bevel DWc of the substrate DW. The scattering direction of the droplets is changed by the bevel DWc. Therefore, it is possible to supply the droplets of the second chemical liquid to the wide range.

In the process S403, the moving mechanism 53 may move the second chemical liquid nozzle 51 back and forth between the seventh position and the eighth position. By reciprocating the second chemical liquid nozzle 51 in this way, a sufficient amount of the droplets of the second chemical liquid can be supplied to the wide range. The reciprocation of the second chemical liquid nozzle 51 may be repeated. In a case that the second chemical liquid nozzle 51 is moved back and forth between the seventh position and the eighth position, the rotation direction of the substrate W may be reversed at the moment the second chemical liquid nozzle 51 reaches the eighth position.

Thereafter, in a process S404, the holder 2 holds the substrate DW horizontally inside the cup 7, the rotator 3 rotates the substrate DW in the second direction RD2, and the center nozzle 61 supplies the pure water to the central portion of the top surface DWa of the substrate DW. The process S404 is the same as the process S205 shown in FIG. 9.

Next, in processes S405 to S408, the same processing as the processes S201 to S204 shown in FIG. 9 is performed.

Then, in a process S409, the holder 2 holds the substrate DW horizontally inside the cup 7, and the rotator 3 rotates the substrate DW in the first direction RD1 to shake off the pure water remaining on the substrate DW, thus allowing the substrate DW to be dried. Thereafter, the transfer device receives the substrate DW from the holder 2 and carries it out of the processing vessel 11.

In this modification example, the center nozzle 61 corresponds to the first nozzle described in the claims; the first chemical liquid nozzle 41 corresponds to the second nozzle described in the claims; and the second chemical liquid nozzle 51 corresponds to a third nozzle described in the claims. Further, in the present modification example, the pure water corresponds to the first processing liquid; the first chemical liquid corresponds to the second processing liquid; and the second chemical liquid corresponds to the third processing liquid. The order of the processes S401 to S408 is not limited to the order shown in FIG. 15. By way of example, the order of the processes S401 to S404 and the processes S405 to S408 may be reversed.

In addition, the center nozzle 61 may discharge the second chemical liquid instead of the pure water in the processes S401 to S403. In this case, since the flows of the second chemical liquid collide with each other, a decrease in the concentration of the second chemical liquid can be suppressed, so that the deposit D can be efficiently dissolved.

In addition, the center nozzle 61 may discharge the first chemical liquid instead of the pure water in the processes S405 to S407. In this case, since the flows of the first chemical liquid collide with each other, the decrease in the concentration of the first chemical liquid can be suppressed, so that the deposit D can be efficiently dissolved.

The center nozzle 61 configured to discharge the first chemical liquid and the center nozzle 61 configured to discharge the second chemical liquid may be separately provided in order to suppress salt precipitation due to a neutralization reaction. In this case, for example, the center nozzle 61 configured to discharge the first chemical liquid corresponds to the first nozzle described in the claims; the first chemical liquid nozzle 41 corresponds to the second nozzle described in the claims; the center nozzle 61 configured to discharge the second chemical liquid corresponds to the third nozzle described in the claims; and the second chemical liquid nozzle 51 corresponds to a fourth nozzle described in the claims. In this case, the first chemical liquid corresponds to the first processing liquid and the second processing liquid, and the second chemical liquid corresponds to the third processing liquid and a fourth processing liquid.

So far, the exemplary embodiment of the cleaning method of the cup of the substrate processing apparatus and the substrate processing apparatus according to the present disclosure has been described. However, it should be noted that the present disclosure is not limited to the above-described exemplary embodiment. Various changes, modifications, replacements, addition, deletion and combinations may be made within the scope of the claims, and all of these are included in the scope of the inventive concept of the present disclosure.

The present application claims priority to Japanese Patent Application No. 2020-081376, field on May 1, 2020, which application is hereby incorporated by reference in their entirety.

According to the exemplary embodiment, it is possible to broaden a cleaning range of the cup of the substrate processing apparatus.

I claim:

1. A cleaning method of a cup of a substrate processing apparatus including a holder configured to hold a substrate horizontally; a rotator configured to rotate the holder about a vertical rotation shaft; a liquid supply unit configured to supply a liquid to a top surface of the substrate held by the holder; and a cup surrounding an edge of the substrate held by the holder to receive the liquid scattered from the edge of the substrate, the cleaning method comprising:

cleaning the cup by supplying a first processing liquid to a central portion of the top surface of the substrate from a first nozzle and, also, supplying a second processing liquid to a periphery of the top surface of the substrate from a second nozzle in a state that the substrate is horizontally held inside the cup and the substrate is rotated in a first direction about the vertical rotation shaft;

cleaning the cup by supplying the first processing liquid to the central portion of the top surface of the substrate from the first nozzle, and, also, supplying the second processing liquid to the periphery of the top surface of the substrate from the second nozzle in a state that the substrate is rotated about the vertical rotation shaft in a second direction opposite to the first direction; and cleaning the cup by changing a scattering direction of droplets of the second processing liquid by moving, during a discharge of the second processing liquid by the second nozzle, the second nozzle in a diametrical direction of the substrate between a first position where a discharge line of the second nozzle touches the periphery of the top surface of the substrate and a second position where the discharge line of the second nozzle deviates from the substrate, and wherein the discharge line of the second nozzle includes a component directed outwards in the diametrical direction of the substrate and a component directed toward the first direction, when viewed from above, and wherein a magnitude of a relative velocity between the second processing liquid and the substrate in the state that the substrate is rotated in the first direction differs from a magnitude of a relative velocity between the second processing liquid and the substrate in the state that the substrate is rotated in the second direction.

2. The cleaning method of claim 1,
wherein the second processing liquid is supplied to a bevel of the substrate from the second nozzle while the second nozzle is being moved between the first position and the second position.

3. The cleaning method of claim 1,
wherein the second nozzle is moved back and forth between the first position and the second position during the discharge of the second processing liquid by the second nozzle.

4. The cleaning method of claim 1,
wherein the discharge of the second processing liquid by the second nozzle is intermittently performed in a state that the second nozzle is fixed at the first position.

5. The cleaning method of claim 1, further comprising:
previously heating the first processing liquid to be discharged from the first nozzle.

6. The cleaning method of claim 1, further comprising:
previously heating the second processing liquid to be discharged from the second nozzle.

7. The cleaning method of claim 1,
wherein the first processing liquid is pure water or an alkaline solution, and the second processing liquid is an alkaline solution,
the first processing liquid is pure water or an acidic solution, and the second processing liquid is an acidic solution, or
both the first processing liquid and the second processing liquid are pure water.

8. The cleaning method of claim 1, further comprising:
supplying a third processing liquid to the periphery of the top surface of the substrate from a third nozzle in a state that the substrate is rotated about the rotation shaft in a second direction opposite to the first direction, and a discharge line of the third nozzle includes a component directed outwards in the diametrical direction of the substrate and a component directed toward the second direction.

9. The cleaning method of claim 8, further comprising:
moving, during a discharge of the third processing liquid by the third nozzle, the third nozzle in the diametrical direction of the substrate between a position where the discharge line of the third nozzle touches the periphery of the top surface of the substrate and a position where the discharge line of the third nozzle deviates from the substrate.

10. The cleaning method of claim 8, further comprising:
supplying the first processing liquid to the central portion of the top surface of the substrate from the first nozzle, and, also, supplying the third processing liquid to the periphery of the top surface of the substrate from the third nozzle in the state that the substrate is rotated about the rotation shaft in the first direction.

11. The cleaning method of claim 8,
wherein the first processing liquid is pure water, a first one of the second processing liquid and the third processing liquid is an alkaline solution, and the second one of the second processing liquid and the third processing liquid is an acidic solution, or
the first processing liquid, the second processing liquid and the third processing liquid are all pure water.

12. The cleaning method of claim 1, further comprising:
supplying a third processing liquid to the central portion of the top surface of the substrate from a third nozzle, and, also, supplying a fourth processing liquid to the periphery of the top surface of the substrate from a fourth nozzle in a state that the substrate is rotated about the rotation shaft in a second direction opposite to the first direction,
a discharge line of the fourth nozzle includes a component directed outwards in the diametrical direction of the substrate and a component directed toward the second direction, and
both the first processing liquid and the second processing liquid are alkaline solutions, and both the third processing liquid and the fourth processing liquid are acidic solutions, or
both the first processing liquid and the second processing liquid are acidic solutions, and both the third processing liquid and the fourth processing liquid are alkaline solutions.

13. A substrate processing apparatus, comprising:
a holder configured to hold a substrate horizontally;
a rotator configured to rotate the holder about a vertical rotation shaft;
a liquid supply unit configured to supply a liquid to a top surface of the substrate held by the holder;
a cup surrounding an edge of the substrate held by the holder to receive the liquid scattered from the edge of the substrate; and
a controller configured to control the rotator and the liquid supply unit,
wherein the liquid supply unit comprises a first nozzle configured to supply a first processing liquid to a central portion of the top surface of the substrate, a second nozzle configured to supply a second processing liquid to a periphery of the top surface of the substrate, and a moving mechanism configured to move the second nozzle in a diametrical direction of the substrate, wherein the controller performs cleaning the cup by supplying the first processing liquid to the central portion of the top surface of the substrate from the first nozzle and, also, supplying the second processing liquid to the periphery of the top surface of the substrate from the second nozzle, in a state that the substrate is horizontally held inside the cup and the substrate is rotated in a first direction about the vertical rotation shaft;

cleaning the cup by supplying the first processing liquid to the central portion of the top surface of the substrate from the first nozzle, and, also, supplying the second processing liquid to the periphery of the top surface of the substrate from the second nozzle in a state that the substrate is rotated about the vertical rotation shaft in a second direction opposite to the first direction; and cleaning the cup by changing a scattering direction of droplets of the second processing liquid by moving, during a discharge of the second processing liquid by the second nozzle, the second nozzle in the diametrical direction of the substrate between a first position where a discharge line of the second nozzle touches the periphery of the top surface of the substrate and a second position where the discharge line of the second nozzle deviates from the substrate, wherein the discharge line of the second nozzle includes a component directed outwards in the diametrical direction of the substrate and a component directed toward the first direction, when viewed from above, and wherein a magnitude of a relative velocity between the second processing liquid and the substrate in the state that the substrate is rotated in the first direction differs from a magnitude of a relative velocity between the second processing liquid and the substrate in the state that the substrate is rotated in the second direction.

* * * * *